United States Patent
Anders et al.

(10) Patent No.: US 9,683,285 B2
(45) Date of Patent: Jun. 20, 2017

(54) FILTERS FOR BLOCKING MACROPARTICLES IN PLASMA DEPOSITION APPARATUS

(71) Applicants: Andre Anders, El Cerrito, CA (US); Jonathan Kolbeck, Berkeley, CA (US)

(72) Inventors: Andre Anders, El Cerrito, CA (US); Jonathan Kolbeck, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 31 days.

(21) Appl. No.: 14/218,434

(22) Filed: Mar. 18, 2014

(65) Prior Publication Data

US 2014/0284207 A1    Sep. 25, 2014

Related U.S. Application Data

(60) Provisional application No. 61/805,037, filed on Mar. 25, 2013.

(51) Int. Cl.
*C23C 14/56* (2006.01)
*C23C 14/35* (2006.01)
*H01J 37/34* (2006.01)

(52) U.S. Cl.
CPC ........... *C23C 14/564* (2013.01); *C23C 14/35* (2013.01); *H01J 37/3405* (2013.01);
(Continued)

(58) Field of Classification Search
CPC .... C23C 14/564; C23C 14/35; H01J 37/3447; H01J 37/3408; H01J 37/3405; H01J 2237/028
See application file for complete search history.

(56) References Cited

U.S. PATENT DOCUMENTS

| 4,452,686 A | 6/1984 | Axenov et al. |
| 5,433,836 A * | 7/1995 | Martin ................. C23C 14/083 204/192.38 |

(Continued)

FOREIGN PATENT DOCUMENTS

WO    WO201206431    5/2012

OTHER PUBLICATIONS

André Anders, "Approaches to rid cathodic arc plasmas of macro- and nanoparticles: a review," Surface and Coatings Technology, vols. 120-121, Nov. 1999, pp. 319-330.

(Continued)

*Primary Examiner* — Michael Band
(74) *Attorney, Agent, or Firm* — Lawrence Berkeley National Laboratory (57) ABSTRACT

This disclosure provides systems, methods, and apparatus related to blocking macroparticles in deposition processes utilizing plasmas. In one aspect, an apparatus includes a cathode, a substrate holder, a first magnet, a second magnet, and a structure. The cathode is configured to generate a plasma. The substrate holder is configured to hold a substrate. The first magnet is disposed proximate a first side of the cathode. The second magnet is disposed proximate a second side of the substrate holder. A magnetic field exists between the first magnet and the second magnet and a flow of the plasma substantially follows the magnetic field. The structure is disposed between the second side of the cathode and the first side of the substrate holder and is positioned proximate a region where the magnetic field between the first magnet and the second magnet is weak.

17 Claims, 5 Drawing Sheets

(52) U.S. Cl.
    CPC ...... *H01J 37/3408* (2013.01); *H01J 37/3447* (2013.01); *H01J 2237/028* (2013.01)

(56) References Cited

U.S. PATENT DOCUMENTS

| | | |
|---|---|---|
| 5,480,527 A | 1/1996 | Welty |
| 6,465,780 B1 | 10/2002 | Anders et al. |
| 6,638,403 B1 * | 10/2003 | Inaba .................... C23C 14/325 118/723 HC |
| 2007/0209934 A1 * | 9/2007 | Meyer .................. C23C 14/325 204/298.41 |
| 2008/0027431 A1 * | 1/2008 | Williams .............. A61L 31/088 606/60 |
| 2013/0206585 A1 * | 8/2013 | Sathrum ............... C23C 14/564 204/192.38 |

OTHER PUBLICATIONS

M. Bilek, A. Anders, I. G. Brown, "Characterization of a linear venetian-blind macroparticle filter for cathodic vacuum arc", IEEE Transaction on Plasma Science, vol. 27 No. 4, 1999, pp. 1197-1202.
P. J. Martin and A. Bendavid, "Review of the filtered vacuum arc process and materials deposition," Thin Solid Films, vol. 394, pp. 1-15, 2001.
Zimmer O. Vacuum arc deposition by using a venetian blind particle filter. Surface and Coatings Technology 2005;200:440e3.

* cited by examiner

FILTERS FOR BLOCKING MACROPARTICLES IN PLASMA DEPOSITION APPARATUS

RELATED APPLICATIONS

This application claims priority to U.S. Provisional Patent Application Ser. No. 61/805,037, filed Mar. 25, 2013, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to the deposition of thin films using plasmas, which may be in a vacuum for metal deposition or in a reactive gas for compound film deposition, and more particularly to the use of arc plasmas for such deposition processes.

BACKGROUND

Plasmas may be used in the deposition of films or layers of material. For example, an arc may be struck between an anode and a consumable cathode, creating a plasma including atoms and ions of the cathode material. These atoms and ions may be directed to the surface of a substrate to deposit a film or layer of the cathode material on a surface of a substrate.

The plasma, however, may contain a number of macroparticles; macroparticles include liquid droplets or solid fragments of the cathode material. The macroparticles in the plasma stream may be the result of a local superheating of the active surface of the cathode. The macroparticles may be incorporated in the deposited film, degrading the quality of the film.

SUMMARY

One innovative aspect of the subject matter described in this disclosure can be implemented an apparatus including a cathode, a substrate holder, a first magnet, a second magnet, and a structure. The cathode has a first side and a second side and is configured to generate a plasma. The substrate holder has a first side and a second side and is configured to hold a substrate. The first magnet is disposed proximate the first side of the cathode. The second magnet is disposed proximate the second side of the substrate holder. A magnetic field exists between the first magnet and the second magnet and a flow of the plasma substantially follows the magnetic field. The structure is disposed between the second side of the cathode and the first side of the substrate holder. The structure is positioned proximate a region where the magnetic field between the first magnet and the second magnet is weak.

In some embodiments, the structure is configured to have a current applied to it. In some embodiments, the first magnet is a permanent magnet, and the second magnet is a permanent magnet.

In some embodiments, the apparatus further includes an anode member, with the cathode and the anode member configured to generate the plasma. In some embodiments, the structure is configured as an anode, with the cathode and the structure configured to generate the plasma.

In some embodiments, the structure is configured to reflect macroparticles generated at the cathode away from the substrate when the apparatus is in operation. In some embodiments, the structure is a substantially planar sheet having a first edge and a second edge, where the structure is disposed with respect to the cathode so that the first edge is closer to the cathode than the second edge.

In some embodiments, the structure includes two substantially planar sheets, where the planar sheets are disposed so that a first end of each planar sheet is in electrical contact with the other and is facing towards the second side of the cathode, and a second end of each planar sheet is not in electrical contact with the other and is facing towards the first side of the substrate holder.

In some embodiments, the structure includes two substantially planar sheets, where the sheets are disposed so that a first end of each sheet is facing towards the second side of the cathode, and a second end of each sheet is facing towards the first side of the substrate holder. In some embodiments, each of the sheets is configured to have a current applied to it, and the current in one sheet flows in an opposite direction to the current in the other sheet.

In some embodiments, the apparatus further includes a first electromagnetic coil and a second electromagnetic coil proximate the substrate holder. The first and the second electromagnetic coils are configured to alter the magnetic field between the first magnet and the second magnet in a direction substantially parallel to a plane that includes the substrate holder. In some embodiments, the first electromagnetic coil and the second electromagnetic coil are configured to be energized with an alternating current.

In some embodiments, the apparatus further includes a first electromagnetic coil and a second electromagnetic coil proximate the substrate holder. The first and the second electromagnetic coils are configured to translate a flow of the plasma substantially perpendicular to a flow direction of the plasma.

In some embodiments, the structure comprises copper configured to be cooled with water. In some embodiments, the structure comprises a refractory material. In some embodiments, the structure blocks straight paths or a line-of-sight between the cathode and the substrate.

In some embodiments, the apparatus further includes a system controller. The system controller is configured to execute instructions so that the apparatus will perform a method including generating the plasma and depositing a film on the substrate, the film including material from the cathode.

Another innovative aspect of the subject matter described in this disclosure can be implemented a method including providing an apparatus including a cathode, a substrate holder, a first magnet, a second magnet, and a structure. The cathode has a first side and a second side. The substrate holder has a first side and a second side and is configured to hold a substrate. The first magnet is disposed proximate the first side of the cathode. The second magnet is disposed proximate the second side of the substrate holder. A magnetic field exists between the first magnet and the second magnet, and a flow of a plasma substantially follows the magnetic field. The structure is disposed between the second side of the cathode and the first side of the substrate holder and is positioned proximate a region where the magnetic field between the first magnet and the second magnet is weak. The method further includes generating the plasma with the cathode and depositing a film on the substrate, the film including material from the cathode.

In some embodiments, the structure blocks macroparticles from the cathode from being incorporated in the film deposited on the substrate.

In some embodiments, the structure blocks straight paths or a line-of-sight between the cathode and the substrate.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Introduction

Cathodic arc deposition is a physical vapor deposition (PVD) technique in which a plasma of a cathode material generated by an electric arc is used to deposit a material on a substrate. For example, the plasma may be a metal plasma or a carbon plasma. The electric arc vaporizes material from a cathode at cathode spots (i.e., current of the electric arc localized on the cathode) to form the plasma, and the vaporized material condenses on a substrate, forming a thin film of layer of the material. Advantages of cathodic arc deposition include a high deposition rate at low process temperatures. Macroparticles (e.g., macroparticles and nanoparticles with sizes from about 0.1 microns to 10 microns), however, may be generated by the plasma-cathode interaction at cathode spots.

The removal of macroparticles from cathodic arc plasmas is a long-standing issue in cathodic arc deposition. In some cases, more than about 90% of macroparticles in the plasma can be removed with relatively simple techniques. Films deposited with filtered arc plasmas, however, may still contain a number macroparticles that are problematic in the semiconductor, data storage, photovoltaic, and smart (e.g., electrochromic) window industries.

The basic principle of a macroparticle filter is to guide the cathodic arc plasma to the substrate, where the substrate is not in a line-of-sight with the cathode. Because macroparticles are relatively large (e.g., micrometers in diameter), they move in almost straight trajectories, while the plasma can be guided by electromagnetic fields; in a first approximation, the plasma follows magnetic field lines. The most common filter is a 90-degree bend filter, in which the plasma is guided down a tube having a 90-degree bend in it. The plasma can be guided by electromagnetic fields to follow the 90-degree bend in the tube, whereas macroparticles impact the interior sides of the tube.

A more recent development in macroparticle filters is the Venetian blind filter. This type of filter includes a set a vanes that is used to deflect macroparticles away from a substrate surface. A review of macroparticle generation and filtering is given in "Approaches to rid cathodic arc plasmas of macro- and nanoparticles: a review," Surface and Coatings Technology, Volumes 120-121, November 1999, Pages 319-330, by André Anders, which is herein incorporated by reference.

Embodiments disclosed herein are related to the deposition of thin films using plasmas (e.g., metal plasmas or carbon plasmas). Vacuum or cathodic arc plasma sources are of particular interest. The disclosed embodiments may also be applied to other plasma sources, including pulsed laser ablation plasmas (e.g., for use in pulsed laser deposition) or plasmas generated by high power impulse magnetron sputtering.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of cathodic arc deposition. However, it should be noted that the techniques of the present invention apply to a wide variety of different physical vapor deposition techniques. In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

Apparatus

As described herein, a macroparticle filter may include a structure disposed between the cathode and the substrate in a cathodic arc deposition apparatus. The structure may block the line-of-sight or straight paths between the cathode and the substrate; the plasma can be guided around the structure. Stated another way, a straight line cannot be drawn between the cathode and the substrate due to the structure. In some embodiments, the structure may be a vane or a planar sheet of material. In some embodiments, the structure can be symmetric or asymmetric.

Two magnets, one behind the cathode and one behind the substrate, may form or generate a magnetic field that guides the plasma around the structure. The magnetic field is weaker between the two magnets than proximate the two magnets; because of this, the magnetic field between the two magnets (e.g., midway between or about midway between the two magnets) may be wider than the magnetic field proximate either of the two magnets. The structure may be disposed in a region where the magnetic field is weak or at a minimum of the strength of the magnetic field (i.e., where the magnetic field is the weakest).

A typical cathodic arc deposition apparatus includes a chamber (e.g., a vacuum chamber) to house components of the apparatus and a power supply. Contained within the chamber are a cathode and a sample holder able to hold a sample onto which the cathode material is to be deposited. In some apparatus, the chamber includes an anode member or the chamber itself may serve as an anode.

Figure 1:
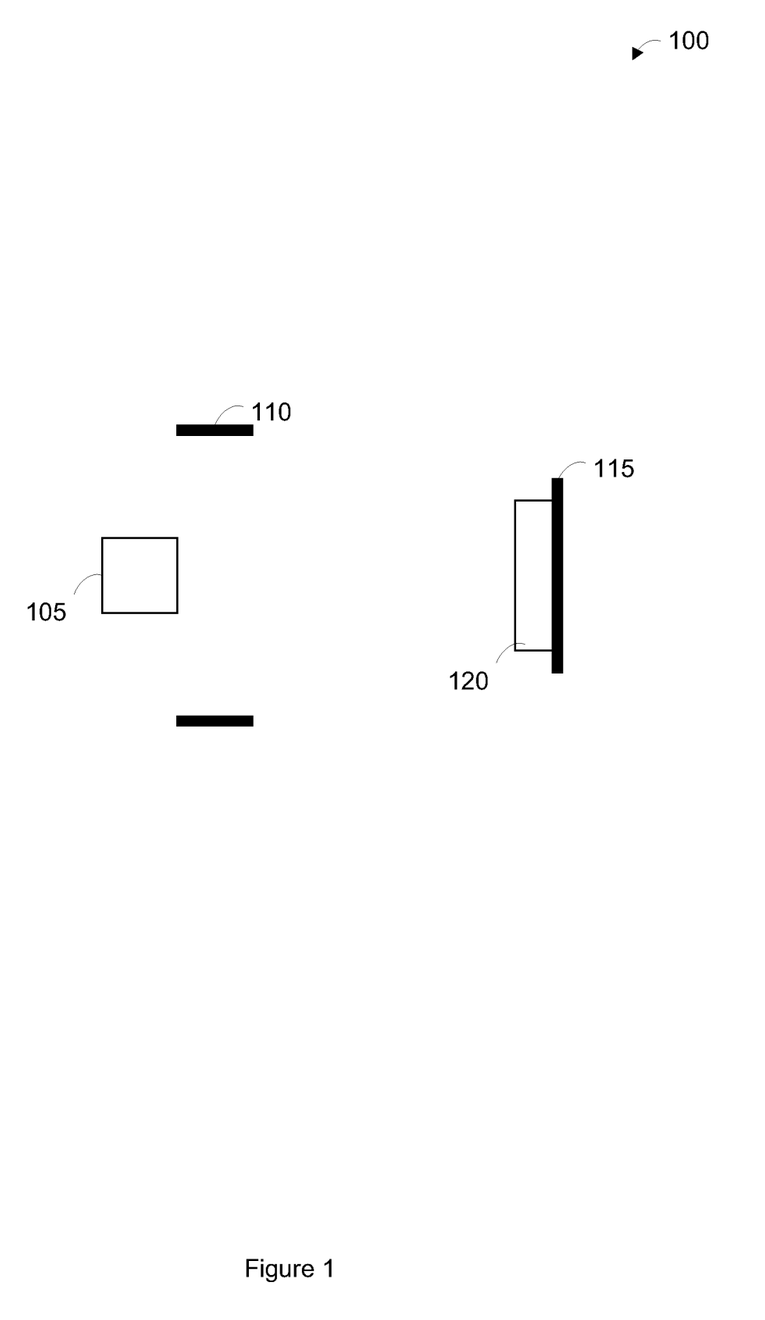
FIG. 1 shows an example of a schematic illustration of a cathodic arc deposition apparatus.

FIG. 1 shows an example of a schematic illustration of a cathodic arc deposition apparatus. A cathodic arc deposition apparatus 100 generally includes a cathode 105, an anode member 110, and a substrate holder 115. The substrate holder 115 is configured to hold a substrate 120 onto which a layer of material is to be deposited. The cathode 105 is a consumable cathode; that is, material from the cathode 105 is vaporized and ionized by an electrical discharge, thereby forming a plasma of the cathode material between the cathode 105 and the anode member 110. This plasma then forms the layer or film on the substrate 120. Not shown in FIG. 1 are a chamber (e.g., a vacuum chamber) housing the components of the cathodic arc deposition apparatus 100, various power supplies that are used to form the plasma, and some mechanisms that may be used to guide the plasma to the substrate. The embodiments disclosed herein may be applicable to different configurations of the cathodic arc deposition apparatus 100.

Figure 2:
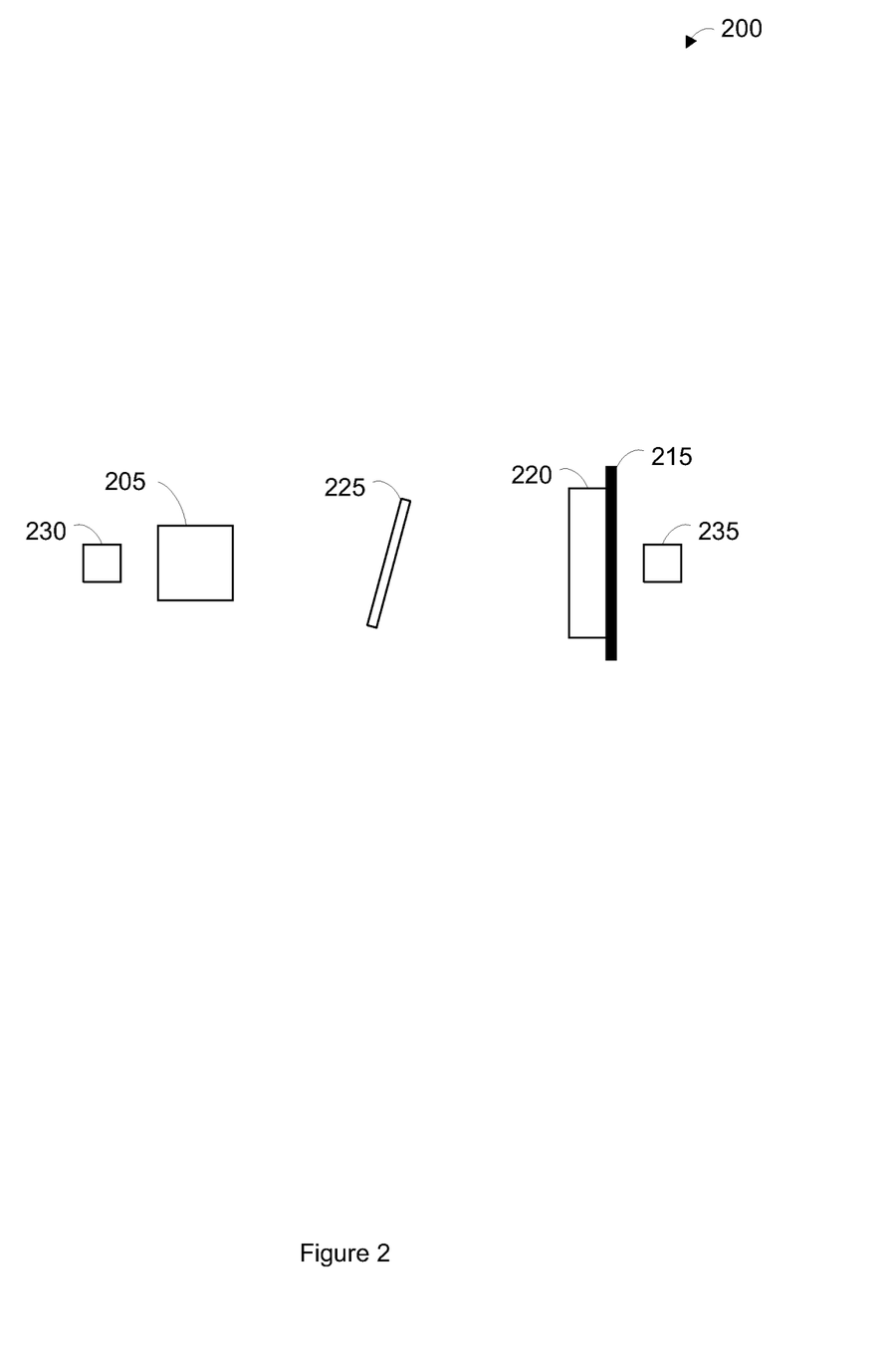
FIG. 2 shows an example of a schematic illustration of a cathodic arc deposition apparatus.

FIG. 2 shows an example of a schematic illustration of a cathodic arc deposition apparatus. A cathodic arc deposition apparatus 200 includes a cathode 205, a substrate holder 215, and a structure 225 disposed between the cathode 205 and the substrate holder 215. The substrate holder 215 is configured to hold a substrate 220 onto which a layer of material is to be deposited. A first magnet 230 is disposed behind the cathode 205 (i.e., not between the cathode 205 and the substrate holder 215). A second magnet 235 is disposed behind the substrate holder 215 (i.e., not between the cathode 205 and the substrate holder 215). In some embodiments, the cathodic arc deposition apparatus 200 may further include a structure that functions as a dedicated anode (e.g., an anode member or an anode structure, not shown). In some embodiments, a chamber (not shown) housing the components of the cathodic arc deposition apparatus 200 may function as the anode. In some embodiments, the structure 225 may function as the anode. In some embodiments, the substrate holder 215, including the substrate 220, may function as the anode. In some embodiments, the cathode 205 and the anode may form a magnetically steered linear arc source.

Stated in a different manner, the cathodic arc deposition apparatus 200 includes a cathode 205, a substrate holder 215, and a structure 225 disposed between the cathode 205 and the substrate holder 215. A first magnet 230 is disposed proximate a first side of the cathode 205, and a second magnet 235 is disposed proximate a second side of the substrate holder 215. The structure 225 is disposed between a second side of the cathode 205 and a first side of the substrate holder 215.

The first magnet 230 and the second magnet 235 establish a magnetic field between the two of them. The magnetic field is weakest at a point between the two magnets, and is stronger on either side of this point approaching the first magnet 230 or the second magnet 235. The structure 225 is disposed proximate this point (i.e., in a region of or at the minimum of the strength of the magnetic field). In some embodiments, the structure 225 blocks the line-of-sight or straight paths between the cathode 205 and the substrate 220 held by the substrate holder 215. The structure 225 blocking the line-of-sight or straight paths between the cathode 205 and the substrate 220 will also block and reflect away from the substrate all or substantially all of the macroparticles generated at the cathode when the cathodic arc deposition apparatus 200 is in operation.

The flow of the plasma, however, substantially follows the magnetic field established between the first magnet 230 and the second magnet 235. At the minimum of strength of the magnetic field, there is a bulge or a widening of the magnetic field. The structure 225 is proximate the minimum of the strength of the magnetic field, such that the magnetic field lines substantially bypass (i.e., curve around) the structure 225. Thus, the plasma substantially following the magnetic field flows around the structure 225 and allows for deposition of the cathode material onto the substrate 220.

In some embodiments, the first magnet 230 and the second magnet 235 may be permanent magnets. In some embodiments, the first magnet 230 and the second magnet 235 may be rare earth permanent magnets, such as neodymium iron boron magnets or samarium cobalt magnets, for example. In some embodiments, the first magnet 230 and the second magnet 235 may have the same strength, and in some embodiments, the first magnet 230 and the second magnet 235 may have different strengths. The strengths of the first magnet 230 and the second magnet 235 may be specified so that a structure 225 may be disposed between the cathode 205 and the substrate 220, with the magnetic field lines substantially bypassing the structure 225.

For example, in an experimental setup in which the cathode and the substrate were about 1 foot apart from one another, a 300 millitesla permanent magnet was placed behind the cathode and a 600 millitesla permanent magnet was placed behind the substrate; here, the magnetic field strength of a permanent magnet refers to the field as measured on the surface of the magnet. The strength of the magnetic field where the structure (i.e., the macroparticle filter or reflector) was placed was about 10 millitesla to 20 millitesla. A plasma can be guided with a magnetic field of about 10 millitesla to 40 millitesla, or about 10 millitesla to 20 millitesla; the strength of the magnets can be adjusted, depending on the size of the apparatus and the distance between the magnets so that the magnetic field between the magnets is sufficient to guide the plasma.

As shown in FIG. 2, in some embodiments, the structure 225 may be a substantially planar sheet of material or a vane (e.g., a rectangular sheet of material or a square of material). The planar sheet may be disposed such that macroparticles impinging the planar sheet will be reflected away from the substrate 220. In some embodiments, this may be accomplished with the planar sheet disposed at an angle between the cathode 205 and the substrate 220. That is, in some embodiments, the planar sheet includes a first edge and a second edge, with the first edge being closer to the cathode 205 than the second edge. In some embodiments, the edges of the planar sheet may be shaped so that the plasma flows smoothly around the planar sheet. For example, the edges of the planar sheet may be blunt.

In some embodiments, the structure 225 may be a curved sheet of material. The curved sheet may be disposed such that the curved sheet at least partially follows the magnetic field lines (i.e., the curved sheet may be substantially parallel to the magnetic field lines). A curved sheet of material as the structure 225 may minimally disturb or not disturb the plasma flow, but still block the line-of-sight between the cathode 205 and the substrate 220. Minimally disturbing the plasma flow may lead to little or no plasma loss.

The structure 225 may be fabricated from any material capable of being exposed to and withstanding a plasma. In some embodiments, the structure 225 may comprise copper. In some embodiments, the copper may be cooled with water flowing through a hollow portion of the structure 225 or by water flowing through metal tubes disposed on a surface of the structure 225.

In some embodiments, the structure 225 may allowed to reach an elevated temperature when the cathodic arc deposition apparatus 200 is in operation. For example, the structure 225 may be allowed to reach a temperature of several hundred degrees Celsius. In these embodiments, the structure 225 may comprise a refractory material, such as tungsten, tantalum, or molybdenum, for example. Heat may be removed from the structure 225 by radiative heat transfer. In some embodiments, radiative heat from the structure 225 may be used to aid in heating the material deposited onto the substrate 220 (e.g., for the deposition of titanium aluminum nitride or doped zinc oxide). In some embodiments, the structure 225 being at an elevated temperature may aid in cleaning the structure. For example, when the cathodic arc deposition apparatus 200 is in operation, material from the cathode may be deposited on both the structure 225 and the substrate 220. Material deposited on the structure 225 may be evaporated from the structure when the structure is at a higher temperature.

In some embodiments, the structure 225 is configured to have a current applied to it when the cathodic arc deposition apparatus 200 is in operation. In some embodiments, applying a current to the structure 225 may be used to tune or to adjust the magnetic field between the first magnet 230 and the second magnet 235. That is, applying a current to the structure 225 will create a magnetic field around the structure 225 that may alter (e.g., break the symmetry of) the magnetic field established by the first magnet 230 and the second magnet 235 and shift the magnetic field lines. By changing the magnetic field established by the first magnet 230 and the second magnet 235, the plasma may be guided so that more of the plasma is incident upon the substrate 220 and the deposition process occurs at a higher rate.

In some embodiments, the substrate holder 215 may be configured to heat the substrate 220. For example, a current and a voltage may be applied to the substrate holder 215 (e.g., using a variable transformer) to heat the substrate holder and the substrate. In some embodiments, an elevated substrate temperature may aid in depositing a material layer having desired characteristics onto the substrate.

In some embodiments, the cathode 205 may be shifted off of an axis of the cathodic arc deposition apparatus 200. For example, an axis of the of the cathodic arc deposition apparatus 200 may be taken as a horizontal line drawn through all of the components shown in FIG. 2. The cathode 205 may be shifted up or down on the pager or into or out of the page in FIG. 2. With the cathode 205 off of the axis of the cathodic arc deposition apparatus 200, the plasma may be better able to flow around the structure, which may increase the deposition rate.

Figure 3:
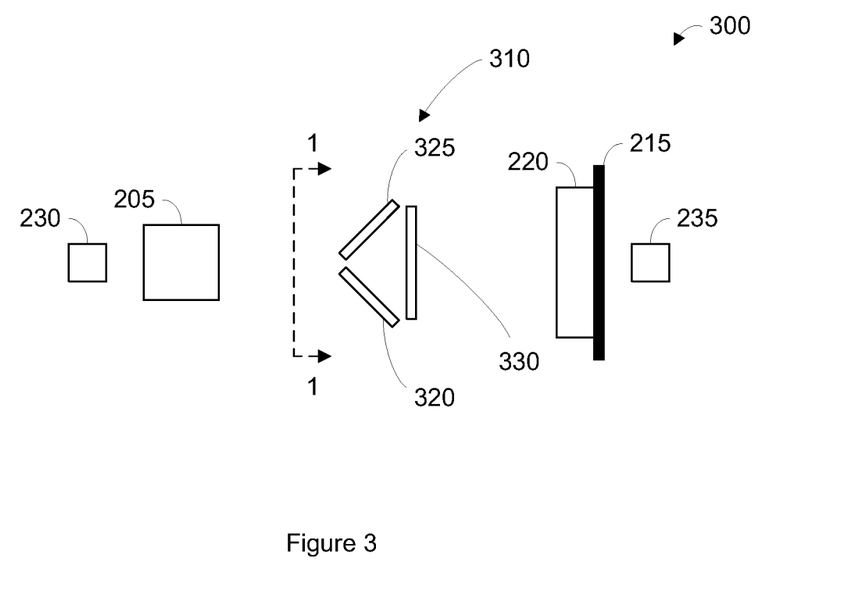
FIGS. 3 and 4 show examples of schematic illustrations of a cathodic arc deposition apparatus.
Figure 4:
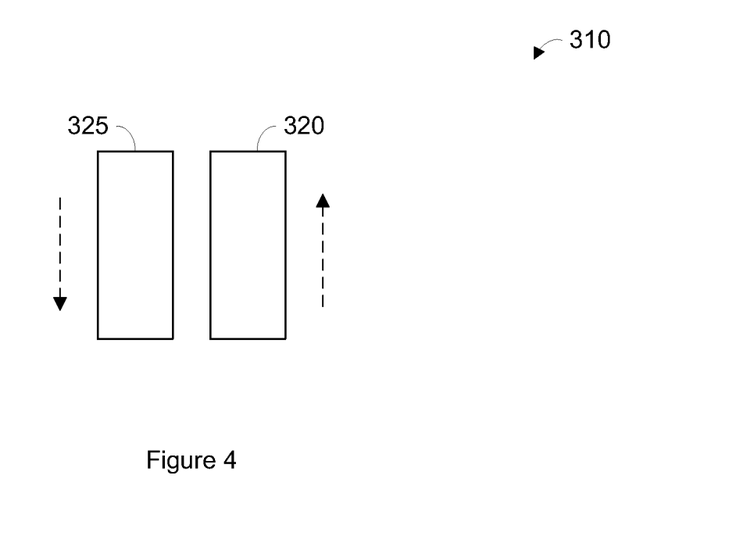

FIGS. 3 and 4 show examples of schematic illustrations of a cathodic arc deposition apparatus. FIG. 4 shows a schematic illustration of a structure of a cathodic arc deposition apparatus through line 1-1 of FIG. 3.

As shown in FIGS. 3 and 4, a cathodic arc deposition apparatus 300 includes a cathode 205, a substrate holder 215, and a structure 310 disposed between the cathode 205 and the substrate holder 215. The substrate holder 215 is configured to hold a substrate 220 onto which a layer of material is to be deposited. A first magnet 230 is disposed behind the cathode 205 (i.e., not between the cathode 205 and the substrate holder 215). A second magnet 235 is disposed behind the substrate holder 215 (i.e., not between the cathode 205 and the substrate holder 215). The cathodic arc deposition apparatus 300 may further include an anode member (not shown).

In some embodiments, the structure 310 may include a first substantially planar sheet of material 320 and a second substantially planar sheet of material 325. The two planar sheets 320 and 325 may be disposed such that macroparticles impinging the planar sheets will be reflected away from the substrate 220. In some embodiments, this may be accomplished by disposing the planar sheets 320 and 325 so that a first end of each planer sheet is proximate the other and closer to the cathode 205 than to the substrate 220. That is, the two planar sheets 320 and 325 may be arranged as a V-shape, with the apex of the V pointed towards the cathode.

In some embodiments, the structure 310 may further include a third sheet of material 330 disposed proximate the second end of each of the planar sheets 320 and 325. That is, the third sheet 330 may be at the opening of the V-shape formed by the two planar sheets 320 and 325. The third sheet 330 may function to block macroparticles that may flow between the first ends of the two planar sheets 320 and 325 when there is a gap between the first ends. In some embodiments, a third sheet of material may be disposed at the apex of V-shape formed by the two planar sheets 320 and 325.

In some embodiments, the first end of each of the two planar sheets 320 and 325 are in contact and in electrical contact with each other. In some embodiments, the two planar sheets 320 and 325 may be formed from a single piece of material that is bent or machined to have a V-shape.

In some embodiments, the first end of each of the two planar sheets 320 and 325 are not in contact or in electrical contact with each other. In this configuration, current, indicated by the dashed lines in FIG. 4, may flow in opposite directions in each of the two planar sheets 320 and 325. Current flowing through the two planar sheets 320 and 325 may create a local magnetic field around each sheet and function to widen the magnetic field established between the first magnet 230 and the second magnet 235; that is, current flowing through the two planar sheets 320 and 325 may function to widen the bulge in the magnetic field between the first magnet 230 and the second magnet 235 that may aid in the transport of the plasma around the two planar sheets. In this configuration, the apparatus is magnetically symmetric.

The structure 310 may include any of the materials of the structure 225 described above with respect to FIG. 2.

Figure 5:
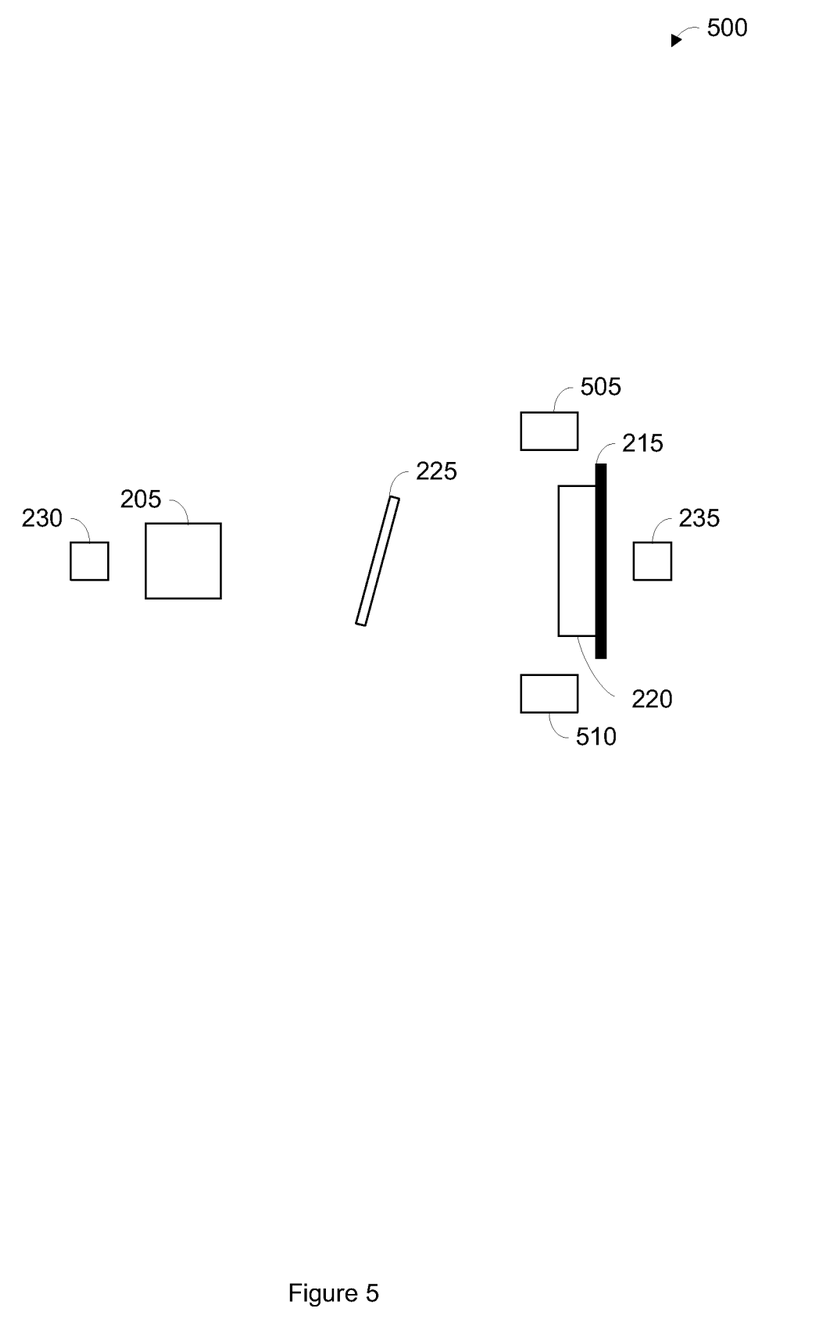
FIG. 5 shows an example of a schematic illustration of a cathodic arc deposition apparatus.

FIG. 5 shows an example of a schematic illustration of a cathodic arc deposition apparatus. A cathodic arc deposition apparatus 500 may be similar to the cathodic arc deposition apparatus 200 shown in FIG. 2, with the addition of a pair of electromagnetic coils.

As shown in FIG. 5, the cathodic arc deposition apparatus 500 includes a cathode 205, a substrate holder 215, and a structure 225 disposed between the cathode 205 and the substrate holder 215. The substrate holder 215 is configured to hold a substrate 220 onto which a layer of material is to be deposited. A first magnet 230 is disposed behind the cathode 205 (i.e., not between the cathode 205 and the substrate holder 215). A second magnet 235 is disposed behind the substrate holder 215 (i.e., not between the cathode 205 and the substrate holder 215). The cathodic arc deposition apparatus 500 may further include an anode member (not shown).

The cathodic arc deposition apparatus 500 further includes a first electromagnetic coil 505 and a second electromagnetic coil 510. Each of the electromagnetic coils includes a conductor (e.g., a copper wire) wound around a cylindrical structure, forming a hoop of the conductor. When electrical current is passed through a coil, it generates a magnetic field. Together, the first and the second electromagnetic coils 505 and 510 may form a Helmholtz coil when each coil carries an equal electrical current flowing in the same direction. A Helmholtz coil is a device that is configured to produce a region of nearly uniform magnetic field.

In some embodiments, the first and the second electromagnetic coils 505 and 510 may form a region of nearly uniform magnetic field between the two coils. In some embodiments, the first and the second electromagnetic coils 505 and 510 may form a magnetic field between the two coils, with the magnetic field not being uniform.

In some embodiments, the first electromagnetic coil 505 and the second electromagnetic coil 510 are proximate the substrate holder 215. When energized, the first electromagnetic coil 505 and the second electromagnetic coil 510 may produce a small variation to the magnetic field established by the first magnet 230 and the second magnet 235. In some embodiments, the small variation in the magnetic fields may be a periodic variation. In some embodiments, the first electromagnetic coil 505 and the second electromagnetic coil 510 are configured to translate or to periodically move a flow of the plasma substantially perpendicular to a flow direction of the plasma. Stated in a different manner, in some embodiments, the first electromagnetic coil 505 and the second electromagnetic coil 510 are configured alter the magnetic field between the first magnet 230 and the second magnet 235 in a direction substantially parallel to a plane that includes the substrate holder 215 and the substrate 220. This can periodically displace the plasma flow before arriving at the substrate. In some embodiments, the uniformity of the magnetic field between the two coils may not be important, so long as the coils are operable to vary the plasma flow.

In some embodiments, altering the plasma flow with the electromagnetic coils 505 and 510 may improve the uniformity of the layer of material deposited onto the substrate 220. In some embodiments, altering the plasma flow in this manner may yield layers of material deposited onto the substrate that are closer to their stoichiometric composition when the cathodic arc deposition apparatus 500 is operated in a reactive mode; a reactive mode is a mode in which material from the cathode reacts with gasses in the environment before being deposited on the substrate 220. For example, a reactive mode could be used to deposit a metal oxide when the cathode comprises a metal and a gas in the environment comprises oxygen.

In some embodiments, the first electromagnetic coil 505 and the second electromagnetic coil 510 are configured to be energized with an alternating current. For example, the alternating current may be about 60 Hz (e.g., mains power system in the United States) or about 50 Hz (e.g., mains power system in Europe). In some embodiments, the first electromagnetic coil 505 and the second electromagnetic coil 510 may be positioned so that the substrate 220 and the substrate holder 215 are inside the coils. In some embodiments, the first electromagnetic coil 505 and the second electromagnetic coil 510 may be positioned so that the substrate 220 and the substrate holder 215 are just outside the electromagnetic coils. That is, the electromagnetic coils 505 and 510 may be positioned just in front of the substrate 220 (i.e., closer to the cathode 205). Positioning the electromagnetic coils 505 and 510 just in front of the substrate 220 may avoid space constraints that may be due to the size of each coil or to the size of a chamber housing the cathodic arc deposition apparatus components.

Electromagnetic coils may be added to any of the cathodic arc deposition apparatus disclosed herein. For example, electromagnetic coils could be added to the cathodic arc deposition apparatus 300 shown in FIG. 3.

While the structures 225 and 310 have been described as planar sheets, other configurations of a structure are possible. For example, a structure may have a curved surface, with a concave or a convex surface facing the cathode. In some embodiments, a structure may include multiple components (e.g., multiple sheets, vanes, or pieces). In some embodiments, a structure may include a single component (e.g., a single sheet, vane, or piece). In some embodiments, the structure may have any number of configurations that are operable to reflect macroparticles impinging on its surface away from the substrate.

It should be noted that the geometries of the cathodic arc deposition apparatus disclosed herein may be well suited for the deposition of materials onto large area substrates because all of the components of the deposition apparatus can be made "linear." That is, a cathodic arc deposition apparatus may have a linear configuration; the cathode can be an elongated, rectangular shape, the structure can be the same length as the cathode, and each of the magnets behind the cathode and the substrate can be long magnetic rods or bars, magnetized across the width of each rod or bar. A large area substrate can have a film deposited on it by moving the substrate linearly across a region (i.e., a line) at which material is being deposited in the cathodic arc deposition apparatus.

The geometries of the cathodic arc deposition apparatus may also have a coaxial configuration (i.e., the configuration can be substantially rotationally symmetric); the cathode can be round (e.g., a disk), the structure can be a cone or cone-shaped (e.g., with the tip of the cone facing the cathode), the magnets behind the cathode and the substrate can be cylindrical or ring-shaped, and the substrate can be round (e.g., a disk, such as a hard disk drive platter, or a round wafer, such as a silicon wafer). Such a coaxial configuration of a cathodic arc deposition apparatus may be used in semiconductor processing, for example.

A coaxially configured cathodic arc deposition apparatus may include two pairs of electromagnetic coils to translate the plasma in two directions instead of one direction, as in the linear configuration. That is, in some embodiments, four electromagnetic coils (i.e., which may form two Helmholtz coils) may be used to translate the plasma in two directions. For example, the electromagnetic coils may be arranged in a +shaped pattern (i.e., a top electromagnetic coil, a bottom electromagnetic coil, a right electromagnetic coil, and a left electromagnetic coil). In some embodiments, good film uniformity on the substrate may be achieved by sweeping the plasma in x-direction and the y-direction, where the plasma flow direction is substantially in the z-direction.

Further, in some embodiments, when in operation the structure in a coaxially configured cathodic arc deposition apparatus may not have a current applied to it. In some embodiments, the structure in a coaxially configured cathodic arc deposition apparatus may be used as the anode of the arc discharge.

Embodiments disclosed herein may be used with high power impulse magnetron sputtering (HiPIMS) apparatus and processes. In HiPIMS apparatus, macroparticle filters are generally not used or installed because the apparatus operate in a magnetron discharge mode where few or no macroparticles are produced. HiPIMS apparatus, however, may arc while in operation, which may generate macroparticles. Embodiments of macroparticle filters disclosed herein may be implemented in HiPIMS apparatus to block any macroparticles that may be generated. This may be important in HiPIMS processes in which high quality films, in which no or very few macroparticles can be tolerated, are to be deposited.

Embodiments disclosed herein also may be implemented in ionized sputtering apparatus and processes, including HiPIMS apparatus and processes, to reduce or prevent the undesired energetic negative ion bombardment of a substrate onto which a material is being deposited; i.e., a macroparticle filter may function as a plasma lens for filtering negative ions. Background regarding this energetic negative ion bombardment can be found in U.S. patent application Ser. No. 13/645,962, which is herein incorporated by reference.

Methods

Figure 6:
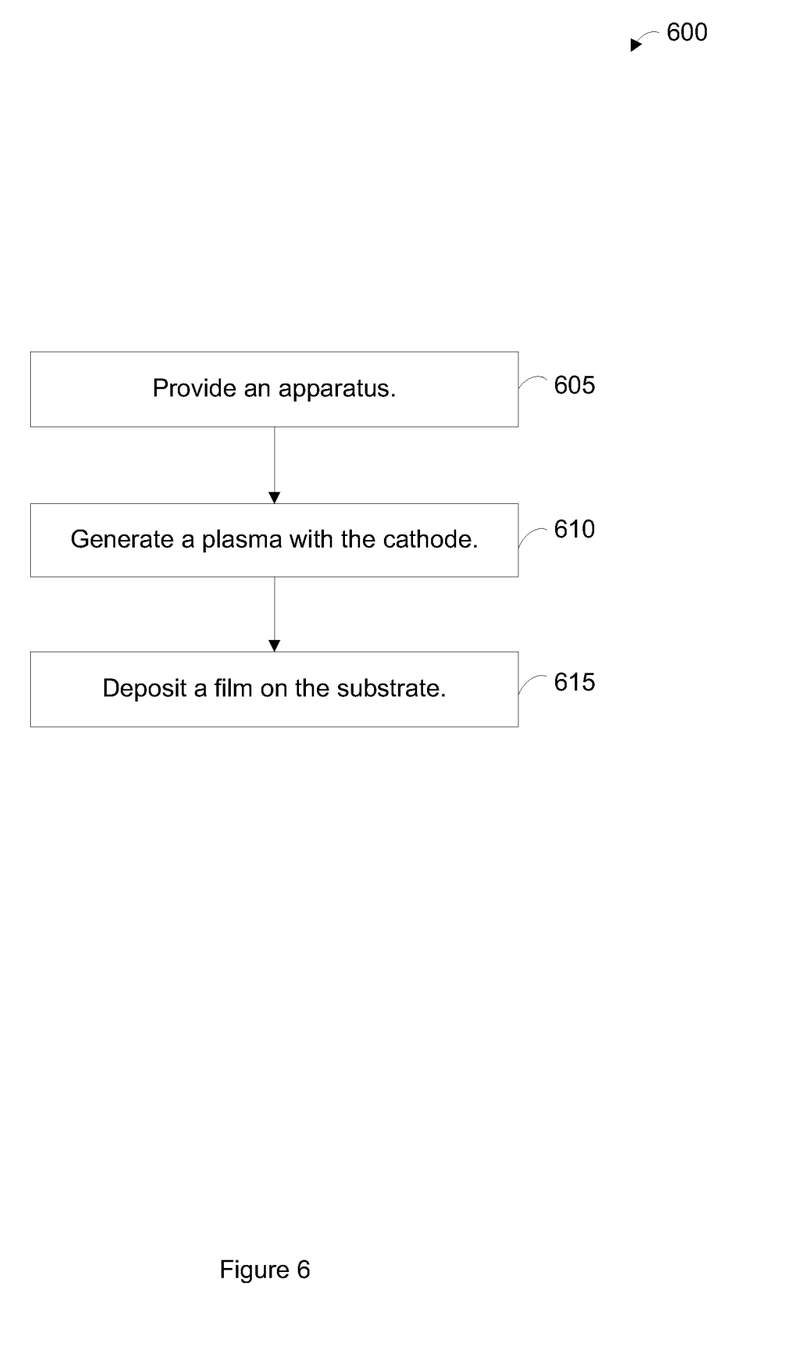
FIG. 6 shows an example of a flow diagram illustrating a deposition process.

FIG. 6 shows an example of a flow diagram illustrating a deposition process. Starting at block 605 of the method 600, an apparatus is provided. The apparatus may include any of the cathodic arc deposition apparatus disclosed herein. At block 610, a plasma is generated. At block 615, a film or layer is deposited on the substrate, with the film or layer including material from the cathode.

Another aspect of the embodiments disclosed herein is an apparatus configured to accomplish the methods described herein. A suitable apparatus includes hardware for accomplishing the process operations and a system controller having instructions for controlling process operations in accordance with the disclosed embodiments. Hardware for accomplishing the process operations includes any of the cathodic arc deposition apparatus disclosed herein. The system controller will typically include one or more memory devices and one or more processors configured to execute the instructions so that the apparatus will perform a method in accordance with the disclosed embodiments. Machine-readable media containing instructions for controlling process operations in accordance with the disclosed embodiments may be coupled to the system controller.

Results

The apparatus and methods disclosed herein have been tested in a number of experiments. In one experiment, a plasma was guided around a structure (i.e., the vane island or the macroparticle blocker) using permanent magnets.

In another experiment, aluminum-doped zinc oxide (AZO) films were deposited on glass slides. The films were typically about 150 nanometers (nm) thick after about two minutes of film deposition. The films exhibited good transmittance (greater than about 80% in the visible) and good conductivity (e.g., about $1.5 \times 10^{-3}$ $\Omega$cm) for room-temperature deposition.

In another experiment, high-quality AZO films were deposited on thick clear plastic sheets and flexible polymer sheets (e.g., overhead project foils).

Applications

Potential applications of the embodiments disclosed herein are set forth below.

To develop the next generation of dynamic windows (e.g., electrochromic windows), high quality coatings or films that may be part of a multilayer coating or film are needed. The presence of macroparticles in such films is highly detrimental because such particles can cause electrical shorts between the layers of a multilayer film. As a result, the desired coloration or de-coloration of the dynamic window may not occur. Further, the window may draw leakage current, using electrical power, quite contrary to the objective of such windows. Embodiments disclosed herein may allow for the formation of high quality coatings without the inclusion of macroparticles.

Further, the improved macroparticle removal from cathodic arc plasmas may make such deposition apparatus and methods applicable to many other industries; the advantages of cathodic arc plasmas, including high deposition rate and the formation of preferred film textures at relatively low substrate temperature, could be made applicable to a much greater field of use. For example, photovoltaic cells, organic light-emitting diodes (OLEDs), displays, touchscreens, etc., use transparent conductors, which could be deposited with cathodic arc plasmas.

Conclusion

Further detail regarding the embodiments disclosed herein can be found in the thesis "Development of a novel macroparticle filter for high quality, high rate thin film deposition using a cathodic arc source" by Jonathan Kolbeck, which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A physical vapor deposition apparatus comprising:
a cathode having a first side and a second side, the cathode being configured to generate a plasma;
a substrate holder having a first side and a second side, the first side of the substrate holder being configured to hold a substrate, the second side of the cathode facing the first side of the substrate holder, the second side of the cathode including a surface from which material of the cathode is vaporized and ionized, the substrate including a surface onto which the material is deposited;
a magnet arrangement operable to guide the plasma, the magnet arrangement consisting of:
a first permanent magnet disposed proximate to and facing the first side of the cathode, the first permanent magnet not being disposed between the cathode and the substrate holder, the first permanent magnet being a single magnet, and
a second permanent magnet disposed proximate to and facing the second side of the substrate holder, the second permanent magnet not being disposed between the cathode and the substrate holder, a magnetic field being generated by and existing between the first permanent magnet and the second permanent magnet, the second permanent magnet being a single magnet; and
a structure disposed between the second side of the cathode and the first side of the substrate holder, the structure consisting of a planar sheet of material, the structure blocking straight paths between the cathode and the substrate, the structure being positioned at a first position proximate a minimum of a strength of the magnetic field between the first permanent magnet and the second permanent magnet, a flow of the plasma substantially following the magnetic field, and the flow of the plasma passing around the structure at the first position.

2. The apparatus of claim 1, wherein the structure is configured to have a current applied to the structure.

3. The apparatus of claim 1, further comprising:
an anode member, wherein the cathode and the anode member are configured to generate the plasma.

4. The apparatus of claim 1, wherein the structure is configured to reflect macroparticles generated at the cathode away from the substrate when the physical vapor deposition apparatus is in operation.

5. The apparatus of claim 1, wherein the planar sheet of material has a first edge and a second edge, and wherein the planar sheet of material is disposed with respect to the cathode so that the first edge is closer to the cathode than the second edge.

6. The apparatus of claim 1, wherein the structure comprises copper configured to be cooled with water.

7. The apparatus of claim 1, wherein the structure comprises a refractory material.

8. The apparatus of claim 1, further comprising:
a system controller, wherein the system controller is configured to execute instructions so that the physical vapor deposition apparatus performs a method including:
generating the plasma; and
depositing a film on the surface of the substrate, wherein the film includes the material from the cathode.

9. A physical vapor deposition apparatus comprising:
a cathode having a first side and a second side, the cathode being configured to generate a plasma;
a substrate holder having a first side and a second side, the first side of the substrate holder being configured to hold a substrate, the second side of the cathode facing the first side of the substrate holder, the second side of the cathode including a surface from which material of the cathode is vaporized and ionized, the substrate including a surface onto which the material is deposited;
a magnet arrangement operable to guide the plasma, the magnet arrangement consisting of:
a first permanent magnet disposed proximate to and facing the first side of the cathode, the first permanent magnet not being disposed between the cathode and the substrate holder, the first permanent magnet being a single magnet, and
a second permanent magnet disposed proximate to and facing the second side of the substrate holder, the second permanent magnet not being disposed between the cathode and the substrate holder, a magnetic field being generated by and existing between the first permanent magnet and the second permanent magnet, the second permanent magnet being a single magnet; and
a structure disposed between the second side of the cathode and the first side of the substrate holder, the structure consisting of a planar sheet of material, the structure blocking straight paths between the cathode and the substrate, the structure being positioned at a first position proximate a minimum of a strength of the magnetic field between the first permanent magnet and the second permanent magnet, a flow of the plasma substantially following the magnetic field, the flow of the plasma passing around the structure at the first position, the structure being configured as an anode, and the cathode and the structure configured to generate the plasma.

10. The apparatus of claim 9, wherein the structure is configured to have a current applied to the structure.

11. The apparatus of claim 9, wherein the structure is configured to reflect macroparticles generated at the cathode away from the substrate when the physical vapor deposition apparatus is in operation.

12. The apparatus of claim 9, wherein the planar sheet of material has a first edge and a second edge, and wherein the planar sheet of material is disposed with respect to the cathode so that the first edge is closer to the cathode than the second edge.

13. The apparatus of claim 9, wherein the structure comprises copper configured to be cooled with water.

14. The apparatus of claim 9, wherein the structure comprises a refractory material.

15. The apparatus of claim 9, wherein the planar sheet of material is disposed at an angle with respect to the straight paths between the cathode and the substrate.

16. The apparatus of claim 9, further comprising:
a system controller, the system controller configured to execute instructions so that the physical vapor deposition apparatus performs a method including:
generating the plasma; and
depositing a film on the surface of the substrate, wherein the film includes the material from the cathode.

17. The apparatus of claim 1, wherein the planar sheet of material is disposed at an angle with respect to the straight paths between the cathode and the substrate.

* * * * *